United States Patent
Tauchi et al.

(10) Patent No.: US 7,695,792 B2
(45) Date of Patent: *Apr. 13, 2010

(54) SILVER ALLOY REFLECTIVE FILMS FOR OPTICAL INFORMATION RECORDING MEDIA, SILVER ALLOY SPUTTERING TARGETS THEREFOR, AND OPTICAL INFORMATION RECORDING MEDIA

(75) Inventors: Yuki Tauchi, Kobe (JP); Junichi Nakai, Kobe (JP); Hideo Fujii, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/425,062

(22) Filed: Jun. 19, 2006

(65) Prior Publication Data
US 2007/0020139 A1    Jan. 25, 2007

(30) Foreign Application Priority Data
Jul. 22, 2005  (JP) ............................. 2005-213202

(51) Int. Cl.
*B32B 3/02* (2006.01)
(52) U.S. Cl. .................. 428/64.1; 428/64.4; 430/270.12
(58) Field of Classification Search ............... 428/64.1, 428/64.4; 430/270.12
See application file for complete search history.

(56) References Cited

U.S. PATENT DOCUMENTS

| 4,998,239 | A | * | 3/1991 | Strandjord et al. ....... 369/275.1 |
| 5,948,497 | A |   | 9/1999 | Hatwar et al. |
| 5,989,669 | A | * | 11/1999 | Usami ...................... 428/64.1 |
| 6,007,889 | A |   | 12/1999 | Nee |
| 6,177,186 | B1 |   | 1/2001 | Skoog et al. |
| 6,229,785 | B1 |   | 5/2001 | Kitaura et al. |
| 6,280,811 | B1 |   | 8/2001 | Nee |
| 6,544,616 | B2 |   | 4/2003 | Nee |

(Continued)

FOREIGN PATENT DOCUMENTS

EP    1 617 427    1/2006

(Continued)

OTHER PUBLICATIONS

U.S. Appl. No. 11/353,168, filed Feb. 14, 2006, Yuuki Tauchi, et al.

(Continued)

*Primary Examiner*—Elizabeth Mulvaney
(74) *Attorney, Agent, or Firm*—Oblon, Spivak, McClelland, Maier & Neustadt, L.L.P.

(57) ABSTRACT

A silver alloy reflective film is used in an optical information recording medium and contains silver as a main component, a total of 1 to 10 atomic percent of at least one rare-earth element, and a total of 1 to 15 atomic percent of at least one selected from In, Sn, Al, and Mg, in which the total content of the at least one rare-earth element and the at least one selected from In, Sn, Al, and Mg is 5 atomic percent or more. The silver alloy reflective film preferably further contains 0.01 to 3 atomic percent of at least one of Bi and Sb. A silver alloy sputtering target has the same composition as the silver alloy reflective film.

16 Claims, 1 Drawing Sheet

U.S. PATENT DOCUMENTS

| | | |
|---|---|---|
| 6,689,444 B2 * | 2/2004 | Nakai et al. .............. 428/64.1 |
| 7,022,384 B2 | 4/2006 | Fujii et al. |
| 2002/0034603 A1 | 3/2002 | Nee |
| 2002/0150772 A1 | 10/2002 | Nakai et al. |
| 2004/0028912 A1 | 2/2004 | Tauchi et al. |
| 2004/0048193 A1 * | 3/2004 | Lichtenberger et al. 430/270.11 |
| 2004/0226818 A1 | 11/2004 | Takagi et al. |
| 2004/0238356 A1 | 12/2004 | Matsuzaki et al. |
| 2004/0258872 A1 | 12/2004 | Nee |
| 2004/0263984 A1 | 12/2004 | Nakai et al. |
| 2005/0008883 A1 | 1/2005 | Takagi et al. |
| 2005/0112019 A1 | 5/2005 | Nakai et al. |
| 2005/0153162 A1 | 7/2005 | Takagi et al. |
| 2005/0238839 A1 | 10/2005 | Takagi et al. |
| 2005/0287333 A1 | 12/2005 | Takagi et al. |
| 2006/0013988 A1 | 1/2006 | Tauchi et al. |
| 2006/0104853 A1 | 5/2006 | Tauchi et al. |

FOREIGN PATENT DOCUMENTS

| | | | | |
|---|---|---|---|---|
| JP | | 4-28032 | | 1/1992 |
| JP | | 4-252440 | | 9/1992 |
| JP | | 5-258363 | | 10/1993 |
| JP | | 6-208732 | | 7/1994 |
| JP | | 11-134715 | | 5/1999 |
| JP | | 2000-57627 | | 2/2000 |
| JP | | 2001-184725 | | 7/2001 |
| JP | | 2002-15464 | | 1/2002 |
| JP | | 2002/226927 | | 8/2002 |
| JP | | 2003-155558 | | 5/2003 |
| JP | | 2003155559 A | * | 5/2003 |
| JP | | 2003-160826 | | 6/2003 |
| JP | | 2004-158145 | | 6/2004 |
| JP | | 2004-339585 | | 12/2004 |
| JP | | 2005-332557 | | 12/2005 |
| WO | | WO 94/00840 | | 1/1994 |
| WO | | WO 98/09823 | | 3/1998 |
| WO | WO 2004/006228 A2 | | | 1/2004 |
| WO | WO 2004/094135 A1 | | | 11/2004 |
| WO | | 2005/056848 | | 6/2005 |
| WO | | 2005/056850 | | 6/2005 |
| WO | | WO 2005-056850 | * | 6/2005 |

OTHER PUBLICATIONS

U.S. Appl. No. 11/333,492, filed Jan. 18, 2006, Yuki Tauchi, et al.
U.S. Appl. No. 11/375,036, filed Mar. 15, 2006, Yuki Tauchi, et al.
U.S. Appl. No. 11/425,068, filed Jun. 19, 2006, Nakai, et al.
U.S. Appl. No. 11/428,045, filed Jun. 30, 2006, Fujii, et al.
U.S. Appl. No. 11/612,791, filed Dec. 19, 2006, Nakano, et al.
U.S. Appl. No. 12/100,823, filed Apr. 10, 2008, Tauchi, et al.
U.S. Appl. No. 12/167,597, filed Jul. 3, 2008, Takagi, et al.
U.S. Appl. No. 12/183,700, filed Jul. 31, 2008, Tauchi, et al.
U.S. Appl. No. 12/198,520, filed Aug. 26, 2008, Tauchi, et al.
U.S. Appl. No. 12/261,781, filed Oct. 30, 2008, Matsuzaki.
U.S. Appl. No. 12/266,065, filed Nov. 6, 2008, Tauchi, et al.

* cited by examiner

SILVER ALLOY REFLECTIVE FILMS FOR OPTICAL INFORMATION RECORDING MEDIA, SILVER ALLOY SPUTTERING TARGETS THEREFOR, AND OPTICAL INFORMATION RECORDING MEDIA

BACKGROUND OF THE INVENTION

1. Field of the Invention

The present invention relates to silver (Ag) alloy reflective films for optical information recording media, Ag alloy sputtering targets for the deposition thereof, and optical information recording media. More specifically, it relates to reflective films which have low thermal conductivities, low melting temperatures, high reflectivities, and high corrosion resistance and therefore enable marking of optical information recording media such as CDs, DVDs, Blu-ray Discs, and HD-DVDs typically using laser after the preparation of the media. The present invention also relates to sputtering targets for the deposition of the reflective films, and optical information recording media having the reflective films.

2. Description of the Related Art

Optical information recording media (optical discs) include various types, and the three main types categorized by the writing/reading system are read-only, write-once, and rewritable optical discs.

Of these optical discs, read-only discs have recorded data formed by concave and convex pits on a transparent plastic substrate such as a polycarbonate substrate upon the manufacture of the discs, and a reflective layer mainly containing, for example, Al, Ag, or Au is arranged on the recorded data, as illustrated in FIG. 1. The data are read out by detecting phase difference or reflection difference of laser beam applied to the discs. Certain optical discs include a substrate containing recording pits and a reflective layer arranged on the recording pits, and another substrate bearing recording pits and a semi-reflective layer arranged on the recording pits. The two substrates are laminated, and the data recorded on the two layers are read out. Data recorded on one side according to this recording/reading system are read-only data that cannot be additionally wrote and altered, and optical discs using this system include CD-ROMs/DVD-ROMs, and DVD-Videos. FIG. 1 is a schematic view of the sectional structure of a read-only optical disc. The optical disc in FIG. 1 includes polycarbonate substrates 1 and 5, a semi-reflective layer (Au, Ag alloy, and Si) 2, an adhesive layer 3, and a total-reflective layer (Ag alloy) 4.

These read-only optical discs are produced in quantities, and information is recorded upon production of the discs by pressing with stampers having patterns of the information. Thus, IDs cannot be significantly given to individual discs. However, read-only optical discs individually having IDs formed using a dedicated system such as a label gate system or a burst cutting area (BCA) system after the preparation of the discs are being standardized typically for preventing unauthorized copying, improving traceability in distribution of products, and increasing added values of products. The ID marking (recording) is mainly carried out by a method of applying laser beam to discs after production to melt an Al alloy in the reflective film and to form holes therein.

Aluminum alloys, such as Al—Mg alloys according to Japanese Industrial Standards (JIS) 6061, are distributed in quantities as general construction materials, are inexpensive and are thereby widely used as reflective films of read-only optical discs. In contrast, Ag alloys having higher reflectivities are widely used in recordable (write-once and rewritable) optical discs.

These materials, however, have high thermal conductivities and require high laser power for marking, which results in damages on base materials including polycarbonate substrates and adhesive layers. Additionally, they have low corrosion resistance, and voids formed as a result of laser marking invite corrosion of the reflective film when held under conditions of high temperatures and high humidity after laser marking. Reflective films containing Ag alloys show decreased reflectivities at high temperatures due to cohesion of Ag reflective films caused by the low thermal stability of Ag. To carry out laser marking at a lower power, the reflective films must have lower thermal conductivities and, in addition, increased light absorptivities (laser-beam absorptivities) and lower melting temperatures.

Japanese Laid-open (Unexamined) Patent Application Publication (JP-A) No. 1992-252440 (Hei 04-252440) discloses a method for reducing the thermal conductivity of an Ag alloy by incorporating Ge, Si, Sn, Pb, Ga, In, Tl, Sb, or Bi into Ag. JP-A No. 1992-28032 (Hei 04-28032) discloses a method for reducing the thermal conductivity of an Ag alloy by incorporating Cr, Ti, Si, Ta, Nb, Pt, Ir, Fe, Re, Sb, Zr, Sn, or Ni into Ag. The resulting reflective films obtained according to these techniques, however, are not intended to be melted and removed by laser irradiation, and some of them show increasing melting temperatures with decreasing thermal conductivities thereof. Silver alloys (Ag alloys) satisfying requirements as Ag alloys for laser marking have not yet been provided.

As is described above, Ag alloy thin films provided for laser marking must have low thermal conductivities, low melting temperatures, and high corrosion resistance.

Current reflective films for read-only optical discs use JIS 6061 series Al alloys, but these Al alloys do not satisfy the requirements for laser marking in thermal conductivity and corrosion resistance.

SUMMARY OF THE INVENTION

Under these circumstances, an object of the present invention is to provide an Ag alloy reflective film for optical information recording media which can be easily marked by laser beam when used in read-only optical discs. Another object of the present invention is to provide an optical information recording medium including the reflective film, and a sputtering target for the deposition of the reflective film.

After intensive investigations to achieve the above objects, the present inventors have found that an Ag alloy thin film containing Ag and specific contents of specific alloying elements has a low thermal conductivity, a low melting temperature, and high corrosion resistance and serves as a reflective thin layer (thin metal layer) suitable as a reflective film for optical information recording media that can satisfactorily undergo laser marking. The present invention has been accomplished based on these findings and has achieved the above objects.

Accordingly, the present invention relates to Ag alloy reflective films for optical information recording media, optical information recording media, and Ag alloy sputtering targets for the deposition of the Ag alloy reflective films and provides Ag alloy reflective films for optical information recording media in a first aspect, optical information recording media in a second aspect, and Ag alloy sputtering targets for the deposition of the Ag alloy reflective films in a third aspect.

Specifically, the present invention provides, in the first aspect, an Ag alloy reflective film for optical information recording media, containing Ag as a main component, a total of 1 to 10 atomic percent of at least one rare-earth element, and a total of 1 to 15 atomic percent of at least one selected from the group consisting of In, Sn, Al, and Mg, in which the total content of the at least one rare-earth element and the at least one selected from the group consisting of In, Sn, Al, and Mg is 5 atomic percent or more.

In the Ag alloy reflective film, the at least one rare-earth element can be at least one selected from the group consisting of Nd, Gd, and Y.

The Ag alloy reflective film can further contain 0.01 to 3 atomic percent of at least one of Bi and Sb.

The present invention also provides, in the second aspect, an optical information recording medium containing the Ag alloy reflective film according to the first aspect.

In addition, the present invention provides, in the third aspect, an Ag alloy sputtering target for the deposition of Ag alloy reflective films for optical information recording media, containing Ag as a main component, a total of 1 to 10 atomic percent of at least one rare-earth element, and a total of 1 to 15 atomic percent of at least one selected from the group consisting of In, Sn, Al, and Mg, in which the total content of the at least one rare-earth element and the at least one selected from the group consisting of In, Sn, Al, and Mg is 5 atomic percent or more.

In the Ag alloy sputtering target, the at least one rare-earth element can be at least one selected from the group consisting of Nd, Gd, and Y.

The Ag alloy sputtering target can further contain 0.01 to 3 atomic percent of Sb.

The Ag alloy sputtering target can further contain 0.03 to 10 atomic percent of Bi, instead of or in addition to Sb.

The Ag alloy reflective films for optical information recording media according to the present invention can be easily marked by laser beam when used in read-only optical discs. The optical information recording media according to the present invention include the Ag alloy reflective films and can be suitably marked by laser beam when used as read-only optical discs. By using the Ag alloy sputtering targets according to the present invention, the Ag alloy reflective films can be deposited.

Further objects, features and advantages of the present invention will become apparent from the following description of the preferred embodiments with reference to the attached drawing.

DESCRIPTION OF THE PREFERRED EMBODIMENTS

Figure 1:
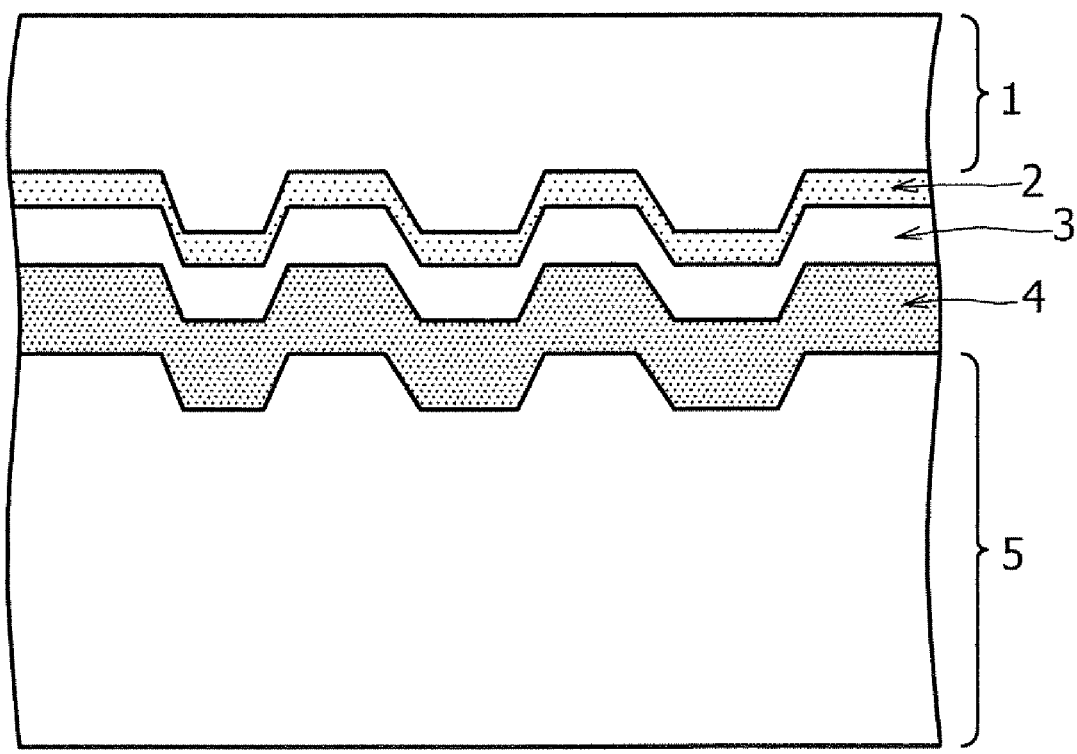
FIG. 1 is a schematic view of the sectional structure of a read-only optical disc.

As is described above, Ag alloy thin films provided for laser marking must have low thermal conductivities, low melting temperatures, and high corrosion resistance.

The present inventors made Ag alloy sputtering targets containing Ag and a variety of elements, produced Ag alloy thin films having various compositions by sputtering using these targets, determined the compositions and properties of the thin films as reflective thin layers, and found the following findings (1) and (2).

(1) An Ag alloy thin film can have a reduced thermal conductivity and an increased laser-beam absorptivity while maintaining its satisfactory reflectivity necessary for an optical recording medium by incorporating into Ag a total of 1 to 10 atomic percent of at least one rare-earth element and a total of 1 to 15 atomic percent of at least one selected from the group consisting of In, Sn, Al, and Mg, in which the total content of the at least one rare-earth element and the at least one selected from the group consisting of In, Sn, Al, and Mg is set at 5 atomic percent or more. If the total content of at least one rare-earth element is less than 1 atomic percent ("atomic percent" is hereinafter also referred to as "%", unless otherwise specified), the thermal conductivity is not effectively reduced. If it exceeds 10%, the resulting thin film has an elevated melting temperature and decreased durability. If the total content of the at least one selected from the group consisting of In, Sn, Al, and Mg is less than 1%, the melting temperature is not effectively reduced. If it exceeds 15%, the reflective film has a decreased reflectivity with respect to laser beam for reading out information from the optical recording medium, resulting in reduced signal output. If the total content of the at least one rare-earth element and the at least one selected from the group consisting of In, Sn, Al, and Mg is less than 5%, the thermal conductivity and the melting temperature are not effectively reduced, and the resulting optical recording medium may not significantly be marked by laser beam at a low power.

(2) By further incorporating at least one of Bi and Sb, the corrosion and cohesion under conditions of high temperatures and high humidity can further be prevented, to thereby further prevent the reflectivity from decreasing. The total content of these elements is preferably 3% or less to avoid decreased reflectivity as a result of alloying. If the total content of these elements is less than 0.01%, the reflectivity may not effectively be prevented from decreasing. The total content of these elements is more preferably 0.1% or more and 2% or less.

The present invention has been achieved based on these findings and provides Ag alloy reflective films for optical information recording media, optical information recording media using the Ag alloy reflective films, and sputtering targets for the deposition of the Ag alloy reflective films which have the above configurations.

The Ag alloy reflective films for optical information recording media according to the present invention are Ag alloy reflective films each comprising Ag as a main component, a total of 1 to 10 atomic percent of at least one rare-earth element, and a total of 1 to 15 atomic percent of at least one selected from the group consisting of In, Sn, Al, and Mg, in which the total content of the at least one rare-earth element and the at least one selected from the group consisting of In, Sn, Al, and Mg is 5 atomic percent or more.

As is obvious from the above finding (1), the Ag alloy reflective films for optical recording media having the configuration have sufficient reflectivities for optical recording media, low melting temperatures, low thermal conductivities, and high laser-beam absorptivities, and can thereby be easily marked by laser beam. In addition, they have excellent corrosion resistance and good durability.

Accordingly, the Ag alloy reflective films according to the present invention can be satisfactorily marked by laser beam and are advantageously used as reflective films for optical information recording media. Specifically, they can be easily marked by laser beam, have sufficient reflectivities necessary for optical recording media and show excellent corrosion resistance and good durability. Namely, the reduction of reflectivities thereof due to corrosion or cohesion of Ag under conditions of high temperatures and high humidity can be inhibited.

The Ag alloy reflective films for optical information recording media according to the present invention preferably further comprise 0.01% to 3% of at least one of Bi and Sb.

This configuration further prevents the reduction of reflectivities thereof due to corrosion or cohesion of Ag under conditions of high temperatures and high humidity, as is obvious from the finding (2).

The at least one rare-earth element for use in the Ag alloy reflective films according to the present invention can be, for example, at least one selected from the group consisting of Nd, Gd, and Y.

The thickness of the Ag alloy reflective films is preferably 5 nm to 200 nm and more preferably 10 nm to 100 nm. The reasons for specifying the range will be described below. Laser marking can be carried out more easily with a decreasing thickness of the reflective film. However, if the thickness is as small as less than 5 nm, the reflective film may transmit the laser beam excessively and thereby have a reduced reflectivity. Thus, the thickness is preferably 5 nm or more, and more preferably 10 nm or more. In contrast, if the Ag alloy reflective film has an excessively large thickness as large as exceeding 200 nm, the laser power to melt the reflective film must be increased, and marks become difficult to form. Thus, the thickness is preferably 200 nm or less, and more preferably 100 nm or less. Additionally, the surface smoothness of the film decreases and the laser beam may become susceptible to scattering with an increasing thickness, to fail to yield high signal output. Thus, the thickness is preferably 200 nm or less and more preferably 100 nm or less.

The optical information recording media according to the present invention comprise any of the Ag alloy reflective films according to the present invention. They can be satisfactorily marked by laser beam and avoid thermal damages of constitutional components of discs, such as polycarbonate substrates and adhesive layers, due to excessive laser power. They also have excellent corrosion resistance and are resistant to the reduction of reflectivity due to corrosion or cohesion under conditions of high temperatures and high humidity.

The optical information recording media according to the present invention have the above-mentioned excellent properties and can be advantageously marked by laser beam.

The Ag alloy sputtering targets according to the third aspect of the present invention are Ag alloy sputtering targets for the deposition of Ag alloy reflective films for optical information recording media, each comprising Ag as a main component, a total of 1 to 10 atomic percent of at least one rare-earth element, and a total of 1 to 15 atomic percent of at least one selected from the group consisting of In, Sn, Al, and Mg, in which the total content of the at least one rare-earth element and the at least one selected from the group consisting of In, Sn, Al, and Mg is 5 atomic percent or more. These Ag alloy sputtering targets can yield the Ag alloy reflective films for optical information recording media according to the present invention.

The Ag alloy sputtering targets according to the present invention can further comprise 0.01 to 3 atomic percent of Sb. In this case, the Ag alloy sputtering targets can yield, of the Ag alloy reflective films for optical information recording media according to the present invention, those comprising 0.01 to 3 atomic percent of Sb. Alternatively or in addition to Sb, the Ag alloy sputtering targets can further comprise 0.03 to 10 atomic percent of Bi. The resulting Ag alloy sputtering targets can yield, of the Ag alloy reflective films for optical information recording media according to the present invention, those further comprising 0.01 to 3 atomic percent of Bi. In this connection, the contents of In, Sn, Al, Mg, and Sb in the sputtering targets are reflected to the contents of the elements in the resulting reflective films, but the Bi content of the reflective film decreases to several tens of percent of the Bi content of the sputtering targets. Therefore, the Ag alloy sputtering targets have the above-specified composition (contents of elements).

The Ag alloy sputtering targets according to the present invention can be at least one selected from the group consisting of Nd, Gd, and Y, as these elements are preferably rare-earth elements. By this configuration, the sputtering targets can yield the Ag alloy reflective films for optical recording media according to the present invention which comprise at least one selected from the group consisting of Nd, Gd, and Y as the at least one rare-earth element.

EXAMPLES

The present invention will be illustrated in further detail with reference to several examples and comparative examples below. It is to be noted that the followings are only examples which by no means limit the scope of the present invention, and various changes and modifications are possible therein without departing from the teaching and scope of the present invention. Hereinafter an Ag alloy comprising elements $M_1$ and $M_2$ is indicated as Ag-$M_1$-$M_2$ alloy, and an Ag alloy comprising elements $M_1$, $M_2$ and $M_3$ is indicated as Ag-$M_1$-$M_2$-$M_3$ alloy. Likewise, "Ag-x$M_1$-y$M_2$ alloy" means an Ag alloy comprising "x" atomic percent of $M_1$ and "y" atomic percent of $M_2$, and "Ag-x$M_1$-y$M_2$-z$M_3$ alloy" means an Ag alloy comprising "x" atomic percent of $M_1$, "y" atomic percent of $M_2$, and "z" atomic percent of $M_3$.

Experimental Example 1

Ag alloy thin films having the compositions in Table 1, namely, Ag—Nd—In alloy thin films (Ag alloy thin films containing Nd and In) [Nos. 1 to 5], Ag—Gd—In alloy thin films [Nos. 6 to 10], and Ag—Y—In alloy thin films [Nos. 11 to 15] were deposited. On these thin films, the relations between the contents of Nd, Gd, and Y and the melting temperature, thermal conductivity, reflectivity, and laser power in marking according to burst cutting area (BCA) system (hereinafter referred to as "BCA marking") were determined.

The thin films were deposited in the following manner. On a polycarbonate substrate having a diameter of 120 mm and a thickness of 0.6 mm were deposited Ag—Nd—In alloy thin films, Ag—Gd—In alloy thin films, and Ag—Y—In alloy thin films, respectively, by DC magnetron sputtering. The deposition was carried out at a substrate temperature of 22° C., an Ar gas pressure of 3 mTorr, a deposition rate of 30 nm/sec, and a back pressure of $5 \times 10^{-6}$ Torr or less. The sputtering targets used herein were composite targets each comprising a pure Ag target on which chips of alloying elements were placed.

The melting temperatures of the Ag alloy thin films were measured in the following manner. A sample Ag alloy thin film having a thickness of 1 μm was peeled off from the substrate, and about 5 mg of the peeled film was collected and analyzed using a differential thermal analyzer (DTA). In this procedure, the average of the temperature at which the film starts to melt and the temperature at which the film melting is terminated was defined as the melting temperature. The thermal conductivity was converted from the electrical resistance of a sample Ag alloy thin film deposited to a thickness of 100 nm. The reflectivity of a sample Ag alloy thin film was measured at a wavelength of 405 nm, and this was defined as the reflectivity. The laser power in the BCA marking was determined in the following manner. The BCA laser marking was carried out using the POP-120-8R (Hitachi Computer Peripherals Co., Ltd.) at a beam speed of 8 meters per second to record a random BCA pattern. In this procedure, the laser power at which melting of a sample thin film began was determined while observing the thin film under an optical microscope.

The results are shown in Table 1. Regarding the compositions of the Ag alloy thin films, the In content was fixed at 5% in all the thin films, whereas the Nd, Gd, and Y contents were varied. Specifically, the Nd content was varied in the thin films Nos. 1 to 5; the Gd content was varied in the thin films Nos. 6 to 10; and the Y content was varied in the thin films Nos. 11 to 15. As the In content was fixed at 5%, these thin films satisfy, of the requirements in the Ag alloy thin films according to the present invention, the total content of at least one selected from the group consisting of In, Sn, Al, and Mg of 1% to 15%; and the total content of at least one rare-earth element and at least one selected from the group consisting of In, Sn, Al, and Mg of 5% or more. Some of them satisfy the requirement of the total content of at least one rare-earth element of 1% to 10%, and the others do not.

Table 1 shows that the thermal conductivity and the melting temperature decrease with an increasing total content of Nd, Gd, and Y. Specifically, the thermal conductivity and the melting temperature decrease with an increasing Nd content [Nos. 1 to 5], an increasing Gd content [Nos. 6 to 10], and an increasing Y content [Nos. 11 to 15]. Specifically, higher laser powers are required for marking thin films by laser if the content of Nd, Gd, and Y is less than 1%. In contrast, if it exceeds 10%, sufficiently high reflectivities are not obtained.

These results demonstrate that Ag alloy thin films must satisfy the requirement of the total content of at least one rare-earth element of 1% to 10%, in addition to the requirements of the total content of at least one selected from the group consisting of In, Sn, Al, and Mg of 1% to 15%, and the total content of at least one rare-earth element and at least one selected from the group consisting of In, Sn, Al, and Mg of 5% or more. Specifically, they must satisfy the requirements according to the present invention.

Experimental Example 2

Ag alloy thin films having the compositions in Table 2, namely, Ag—Nd—In alloy thin films [Nos. 1a to 3a], Ag—Nd—Sn alloy thin films [Nos. 4a to 6a], Ag—Nd—Al alloy thin films [No. 7a], and Ag—Nd—Mg alloy thin films [No. 8a] were deposited, the melting temperatures, thermal conductivities and reflectivities of the resulting thin films were measured, and the laser powers in BCA marking to the thin films were determined by the procedures of Experimental Example 1.

The results are shown in Table 2. For the compositions, the Nd content was fixed at 5% in all the thin films, and the contents of In and Sn were varied. Specifically, the In content was varied in the thin films Nos. 1a to 3a, and the Sn content was varied in the thin films Nos. 4a to 6a. As the Nd content was fixed at 5%, these Ag alloy thin films satisfy the requirements of the total content of at least one rare-earth element of 1% to 10%, the total content of at least one rare-earth element and the at least one selected from the group consisting of In, Sn, Al, and Mg of 5% or more. In addition, they also satisfy the requirement of the total content of at least one selected from the group consisting of In, Sn, Al, and Mg of 1% to 15%. Namely, they satisfy all the requirements according to the present invention.

Table 2 shows that the laser power required for marking significantly decrease by the addition of at least one of In, Sn, Al, and Mg, and it decreases with an increasing content of these elements. Specifically, the laser power required for marking decreases with an increasing In content [Nos. 1a to 3a] and an increasing Sn content [Nos. 4a to 6a]. The thin films having an Al content of 5% [No. 7a] or a Mg content of 5% [No. 8a] can be marked by laser beam at a low power. The reflectivity decreases with an increasing content of In or Sn. Specifically, the thin film No. 3a having an In content of 15% shows the lowest reflectivity among the thin films Nos. 1a to 3a; and the thin film No. 6a having a Sn content of 15% shows the lowest reflectivity among the thin films Nos. 4a to 6a. If the total contents of these elements exceeds 15%, the reflectivity further decreases.

These results demonstrate that Ag alloy thin films must satisfy the requirement of the total content of at least one selected from the group consisting of In, Sn, Al, and Mg of 1% to 15%, in addition to the requirements of the total content of at least one rare-earth element of 1% to 10%, and the total content of at least one rare-earth element and at least one selected from the group consisting of In, Sn, Al, and Mg of 5% or more. Specifically, they must satisfy the requirements according to the present invention.

Experimental Example 3

Ag alloy thin films having the compositions in Table 3, namely, an Ag—Nd—In alloy thin film [No. 1b], Ag—Nd—In—Bi alloy thin films [Nos. 2b to 4b], and Ag—Nd—In—Sb alloy thin films [Nos. 5b to 7b] were deposited by the procedure of Experimental Example 1. All the thin films had a thickness of 100 nm. The reflectivities of the Ag alloy thin films were measured at a wavelength of 405 nm. The Ag alloy thin films were then subjected to tests under conditions of high temperatures and high humidity (environmental tests), and the reflectivities after the tests were determined. Thus, changes (decreases) in reflectivity of the thin films due to the environmental tests were determined. The environmental tests were conducted at a temperature of 80° C. and humidity of 85% relative humidity (RH) for a holding time of 96 hours.

The results are shown in Table 3. Table 3 demonstrates that the reduction in reflectivity after the environmental test is prevented by the addition of Bi or Sb. This effect can be seen in a comparison of the thin film No. 1b with the thin films Nos. 2b to 4b and a comparison of the thin film No. 1b with the thin films Nos. 5b to 7b. More specifically, the thin films Nos. 2b to 4b show the effect of the addition of Bi in the comparison with the thin film No. 1b, and the thin films Nos. 5b to 7b show the effect of the addition of Sb in the comparison with the thin film No. 1b.

With an increasing content of Bi or Sb, the reduction in reflectivity as a result of the environmental test is reduced, but the reflectivity of the thin film before the environmental test decreases. The thin films having a total content of Bi and Sb of 0.1% to 3.0% in Table 3 show sufficient reflectivities before the environmental tests. However, if the total content of Bi and Sb exceeds 3%, thin films before the environmental tests show further decreased reflectivities. In contrast, if the total content of Bi and Sb is less than 0.01%, the reflectivities of thin films may not be sufficiently effectively prevented from decreasing. From this viewpoint, the total content of Bi and Sb is preferably 0.01% or more.

TABLE 1

| No. | Composition | Thermal conductivity [W/(K·cm)] | Reflectivity (%) | Melting temperature (°C.) | Laser power (W) |
|---|---|---|---|---|---|
| 1 | Ag—0.5Nd—5In | 0.61 | 78.1 | 928 | >4.0 |
| 2 | Ag—1Nd—5In | 0.54 | 76.1 | 928 | 3.8 |
| 3 | Ag—5Nd—5In | 0.28 | 61.2 | 914 | 2.4 |
| 4 | Ag—10Nd—5In | 0.20 | 58.3 | 871 | 1.7 |
| 5 | Ag—15Nd—5In | 0.13 | 48.2 | 912 | <1.5 |
| 6 | Ag—0.5Gd—5In | 0.60 | 77.3 | 927 | >4.0 |
| 7 | Ag—1.0Gd—5In | 0.58 | 74.2 | 926 | 3.9 |
| 8 | Ag—5Gd—5In | 0.41 | 60.8 | 918 | 2.8 |
| 9 | Ag—10Gd—5In | 0.18 | 54.6 | 868 | 1.9 |
| 10 | Ag—15Gd—5In | 0.15 | 42.1 | 896 | <1.5 |
| 11 | Ag—0.5Y—5In | 0.61 | 79.6 | 932 | >4.0 |
| 12 | Ag—1Y—5In | 0.59 | 77.8 | 930 | 3.8 |
| 13 | Ag—5Y—5In | 0.31 | 63.2 | 906 | 2.5 |
| 14 | Ag—10Y—5In | 0.19 | 54.2 | 878 | 1.7 |
| 15 | Ag—15Y—5In | 0.16 | 48.9 | 906 | <1.5 |

TABLE 2

| No. | Composition | Thermal conductivity [W/(K·cm)] | Reflectivity (%) | Melting temperature (°C.) | Laser power (W) |
|---|---|---|---|---|---|
| 1a | Ag—5Nd—1In | 0.37 | 73.1 | 932 | 3.7 |
| 2a | Ag—5Nd—5In | 0.28 | 61.2 | 914 | 2.4 |
| 3a | Ag—5Nd—15In | 0.15 | 53.2 | 836 | <1.5 |
| 4a | Ag—5Nd—1Sn | 0.36 | 72.0 | 936 | 3.8 |
| 5a | Ag—5Nd—5Sn | 0.24 | 63.2 | 921 | 2.6 |
| 6a | Ag—5Nd—15Sn | 0.13 | 54.6 | 821 | <1.5 |
| 7a | Ag—5Nd—5Al | 0.26 | 68.1 | 915 | 2.4 |
| 8a | Ag—5Nd—5Mg | 0.31 | 72.8 | 926 | 2.9 |

TABLE 3

| No. | Composition | Reflectivity (%) | Change in reflectivity (%) |
|---|---|---|---|
| 1b | Ag—5Nd—5In | 61.5 | −8.9 |
| 2b | Ag—5Nd—5In—0.1Bi | 61.2 | −4.6 |
| 3b | Ag—5Nd—5In—0.5Bi | 60.3 | −3.3 |
| 4b | Ag—5Nd—5In—3.0Bi | 51.3 | −4.1 |
| 5b | Ag—5Nd—5In—0.1Sb | 61.1 | −4.2 |
| 6b | Ag—5Nd—5In—0.5Sb | 60.5 | −3.8 |
| 7b | Ag—5Nd—5In—3.0Sb | 52.3 | −4.8 |

The Ag alloy reflective films for optical information recording media according to the present invention can be easily marked by laser beam when used in read-only optical discs and are useful and advantageous as reflective films for optical information recording media such as read-only optical discs.

What is claimed is:

1. A read-only optical information recording medium for laser marking, comprising an Ag alloy reflective film consisting of:
   Ag as a main component;
   a total of 1 to 10 atomic percent of at least one rare-earth element;
   1 to 15 percent of Al; and
   optionally, 1 to 15 atomic percent of at least one element selected from the group consisting of In and Sn,
   wherein when In and/or Sn is present the total content of In, Sn, and Al ranges from 5 to 15 atomic percent and when In and Sn are not present the total content of Al ranges from 5 to 15 atomic percent.

2. The read-only optical information recording medium of claim 1, wherein the rare-earth element is at least one selected from the group consisting of Nd, Gd, and Y.

3. An Ag alloy sputtering target for the deposition of Ag alloy reflective films for optical information recording media, consisting of:
   Ag as a main component;
   a total of 1 to 10 atomic percent of at least one rare-earth element;
   1 to 15 percent of Al; and
   optionally, 1 to 15 atomic percent of at least one element selected from the group consisting of In and Sn,
   wherein when In and/or Sn is present the total content of In, Sn, and Al ranges from 5 to 15 atomic percent and when In and Sn are not present the total content of Al ranges from 5 to 15 atomic percent.

4. The Ag alloy sputtering target of claim 3, wherein the rare-earth element is at least one selected from the group consisting of Nd, Gd, and Y.

5. The read-only optical information recording medium of claim 1, wherein the rare-earth element is Nd.

6. The read-only optical information recording medium of claim 1, wherein the rare-earth element is Gd.

7. The read-only optical information recording medium of claim 1, wherein the rare-earth element is Y.

8. The read-only optical information recording medium of claim 1, wherein In is present.

9. The read-only optical information recording medium of claim 1, wherein Sn is present.

10. The read-only optical information recording medium of claim 1, wherein the thickness of the Ag alloy reflective film ranges from 5 nm to 200 nm.

11. The read-only optical information recording medium of claim 1, wherein the thickness of the Ag alloy reflective film ranges from 10 nm to 100 nm.

12. The Ag alloy sputtering target of claim 3, wherein the rare-earth element is Nd.

13. The Ag alloy sputtering target of claim 3, wherein the rare-earth element is Gd.

14. The Ag alloy sputtering target of claim 3, wherein the rare-earth element is Y.

15. The Ag alloy sputtering target of claim 3, wherein In is present.

16. The Ag alloy sputtering target of claim 3, wherein Sn is present.

\* \* \* \* \*